United States Patent
Togura et al.

(10) Patent No.: US 7,446,429 B2
(45) Date of Patent: Nov. 4, 2008

(54) INTERIOR VEHICULAR ILLUMINATOR HAVING A CONTROLLABLY DIMMED LIGHT SOURCE

(75) Inventors: Takeshi Togura, Chiba (JP); Nobumasa Misaki, Chiba (JP)

(73) Assignee: Fujikura Ltd., Tokyo (JP)

( * ) Notice: Subject to any disclaimer, the term of this patent is extended or adjusted under 35 U.S.C. 154(b) by 17 days.

(21) Appl. No.: 11/581,462

(22) Filed: Oct. 17, 2006

(65) Prior Publication Data

US 2007/0086200 A1    Apr. 19, 2007

(30) Foreign Application Priority Data

Oct. 18, 2005    (JP)    ............... 2005-302496

(51) Int. Cl.
*B60L 1/14*    (2006.01)

(52) U.S. Cl. .................................. 307/10.8

(58) Field of Classification Search ................ 307/10.8
See application file for complete search history.

(56) References Cited

U.S. PATENT DOCUMENTS

| | | | | |
|---|---|---|---|---|
| 4,119,864 A * | 10/1978 | Petrizio | ..................... | 307/116 |
| 4,246,533 A * | 1/1981 | Chiang | ..................... | 323/349 |
| 4,250,432 A * | 2/1981 | Kohler | ..................... | 315/291 |
| 4,321,479 A * | 3/1982 | Ledniczki et al. | ........... | 307/116 |
| 4,937,702 A * | 6/1990 | Kurihara | ..................... | 361/179 |
| 5,161,879 A * | 11/1992 | McDermott | ................. | 362/206 |
| 5,716,129 A * | 2/1998 | Kunen et al. | ................. | 362/394 |
| 5,867,111 A * | 2/1999 | Caldwell et al. | ............... | 341/33 |
| 6,160,352 A * | 12/2000 | Steinel | ..................... | 315/156 |
| 6,483,245 B1 * | 11/2002 | Weindorf et al. | ............. | 315/82 |
| 6,580,221 B2 * | 6/2003 | Hutzler et al. | ............. | 315/149 |
| 6,728,393 B2 * | 4/2004 | Stam et al. | ................... | 382/104 |
| 6,742,904 B2 * | 6/2004 | Bechtel et al. | ............. | 359/604 |
| 6,750,564 B2 * | 6/2004 | Cencur | ..................... | 307/116 |
| 7,054,133 B2 * | 5/2006 | Orth | ..................... | 361/278 |
| 7,221,271 B2 * | 5/2007 | Reime | ..................... | 340/541 |
| 7,258,469 B2 * | 8/2007 | Manico et al. | ............. | 362/394 |
| 2005/0002103 A1 * | 1/2005 | Bechtel et al. | ............. | 359/604 |

FOREIGN PATENT DOCUMENTS

JP    9-48280 A    2/1997
JP    2000-182784 A    6/2000

* cited by examiner

*Primary Examiner*—Michael J Sherry
*Assistant Examiner*—Adi Amrany
(74) *Attorney, Agent, or Firm*—Sughrue Mion, PLLC

(57) ABSTRACT

A vehicular illuminator having a design board, behind which a sensing electrode having an aperture is located. Arranged between the design board and the sensing electrode is an LED serving as a light source and a light guide plate to defuse light from the LED. The sensing electrode is connected to an electrostatic capacity detector contained in a controller.

13 Claims, 9 Drawing Sheets

INTERIOR VEHICULAR ILLUMINATOR HAVING A CONTROLLABLY DIMMED LIGHT SOURCE

Priority is claimed from Japanese Patent Application No. 2005-302496, filed Oct. 18, 2005, the contents of which are incorporated herein by reference.

BACKGROUND

The present invention relates to a vehicular illuminator serving as an interior lamp inside a vehicle.

DESCRIPTION OF THE RELATED ART

A conventional vehicular illuminator is known as including a switch located in a vehicular compartment to operate interior illumination in a car and the like. In general, as the vehicular illuminator switch, a slide switch or a push switch maybe employed to perform ON/OFF of the vehicular illumination or adjustment of the illuminated light intensity through operation of the switch.

Patent document 1 (JP-A 2000-182784, FIGS. 2-3) discloses a vehicular illuminator comprising a switch unit, which includes a main switch operative to perform ON/OFF of the illumination. It also includes an auxiliary switch operative to perform illuminated light adjustment of the illuminated light intensity on detection of the press at a pressure sensitive sensor located around the main switch. The use of such the pressure sensitive sensor allows the illuminated light adjustment and accordingly reduces space without loss of the appearance compared to mechanical switches such as buttons.

Patent document 2 (JP-A 9-48280, FIG. 1) discloses a vehicular illuminator comprising a switch, which is configured to transmit infrared from one side and receive the reflected light at the other side when an operator makes an approach with a hand or the like. The use of such the sensor allows the operator, for example, a driver to operate the switch only with holding the hand or the like without confirming an accurate position of the switch.

In the vehicular illuminator disclosed in the patent document 1, although the pressure sensitive sensor in the auxiliary switch is used as a dimmer means, the pressure sensitive sensor can not be switched without a direct touch on the sensor. Accordingly, the operator is required to visually confirm the position of the switch.

In the vehicular illuminator disclosed in the patent document 2, although a photo-sensor is used in the switch, ambient light may possibly cause erroneous operation and makes it difficult to adjust the sensor. In addition, the need for continuous transmission of infrared increases power consumed on standby.

SUMMARY OF EXEMPLARY EMBODIMENTS OF THE INVENTION

The present invention has been made in consideration of such problems and accordingly an aspect of the present invention is to provide a vehicular illuminator, which does not require the operator to visually confirm the position of the switch, resulting in reduced erroneous operation and power consumption.

In one aspect the present invention provides a vehicular illuminator, comprising: a sensing electrode; an electrostatic capacity detector operative to detect a value corresponding to an electrostatic capacity between the sensing electrode and the ground and provide a detection value corresponding to the electrostatic capacity; a controller operative to input the detection value for comparison with previously determined n threshold values (n is a natural number) and provide a control value corresponding to a magnitude relation therebetween; and a light source controllably dimmed based on the control value.

The present invention only requires the operator, for example, a driver to make an approach with a hand or the like without the need for confirming an accurate position of the switch. Accordingly, it is possible even in a dark compartment to light on/off the vehicular illumination and adjust the illuminated light intensity only by bringing the hand close. It is also possible to reduce power consumed on standby compared to the photo-sensor.

DETAILED DESCRIPTION OF THE EXEMPLARY EMBODIMENTS OF THE INVENTION

Non-limiting, exemplary embodiments of the present invention will now be described with reference to the accompanying drawings.

Figure 1:
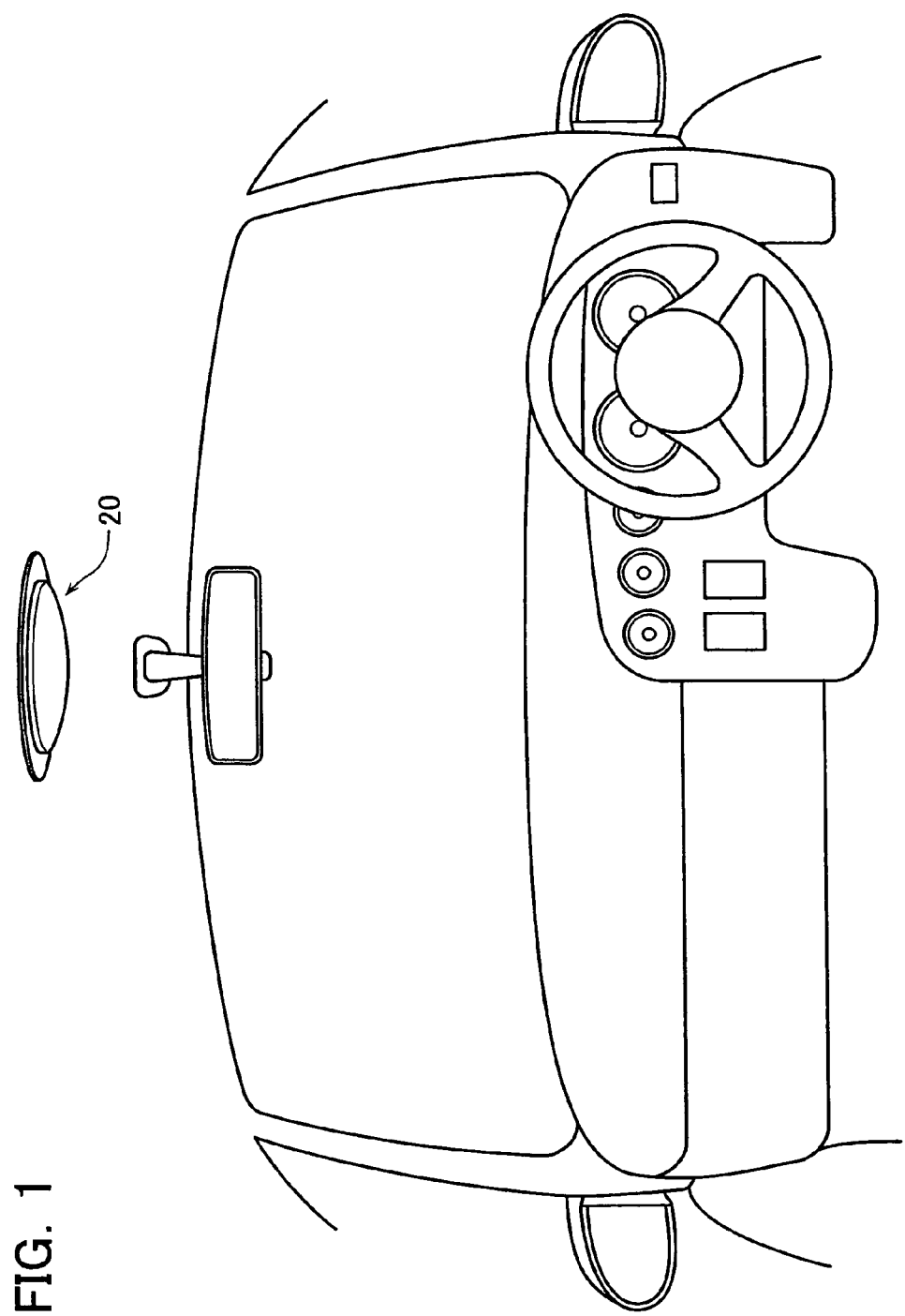
FIG. 1 is a general view of a vehicular illuminator according to a non-limiting embodiment of the present invention.

FIG. 1 shows a compartment in an automobile that uses a vehicular illuminator according to a non-limiting embodiment of the present invention. The vehicular illuminator 20 is employed as a room lamp on the ceiling or the like in the automobile.

Figure 2:
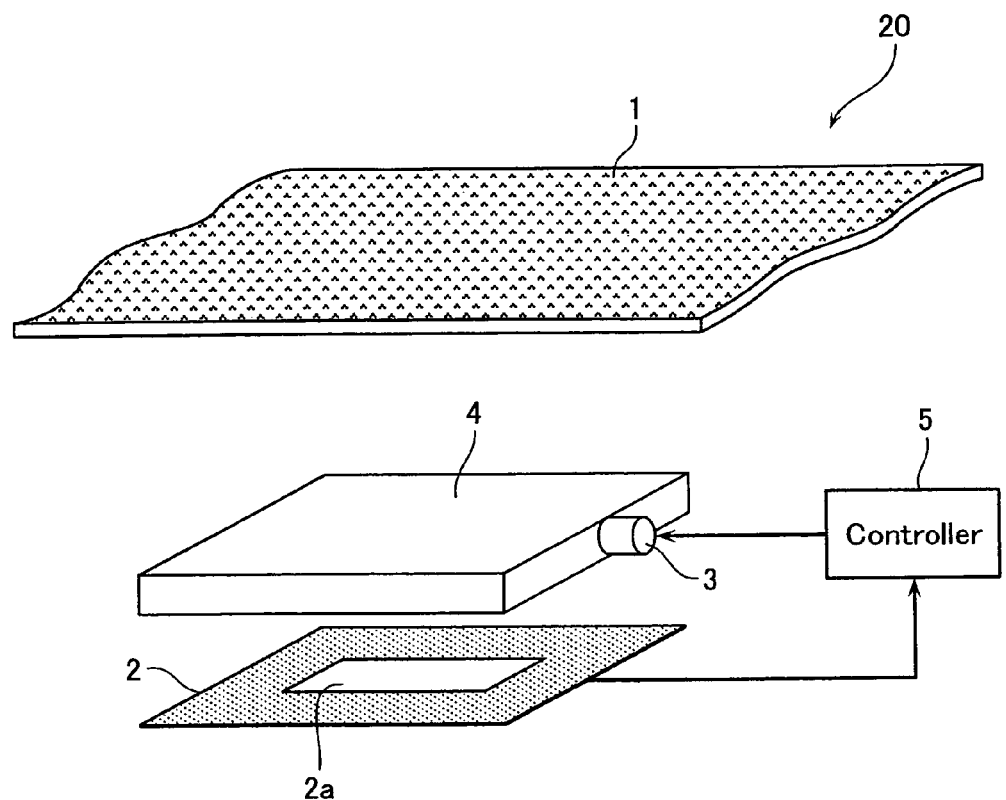
FIG. 2 is an exploded view of the illuminator.

FIG. 2 is an exploded view showing a brief structure of the illuminator.

The vehicular illuminator 20 includes a design board 1 serving as a covering member composed of a light transmissive material such as resin and glass and adjusted to have an arbitrary light transmissivity. It also includes a rectangular sensing electrode 2 located behind the design board 1 and has a central aperture 2a that configures a sensor to detect an approach of a human body. It also includes an LED 3 arranged between the design board 1 and the sensing electrode 2 to serve as a light source. It also includes a light guide plate 4 to diffuse light from the LED 3. The sensing electrode 2 and the LED 3 are electrically connected to a controller 5, which controls the lighting condition of the LED 3 such as the ON/OFF operation and the illuminated light intensity. The sensing electrode 2 may comprise electrically conductive material. It can also comprises a transparent electrode such as metal, ITO (Tin-doped Indium Oxide) or a conductive polymer (PEDOT/PSS: Ethylenedioxythiophene/Polystyrensulphonic acid). The sensing electrode 2 may be located between the design board 1 and the light guide plate 3, otherwise located as a separate sensor apart from the LED 3 and the light guide plate 4. Instead of the LED serving as the light source, a light emitter such as a bulb or an electroluminescence (EL) element may be employed.

Figure 3:
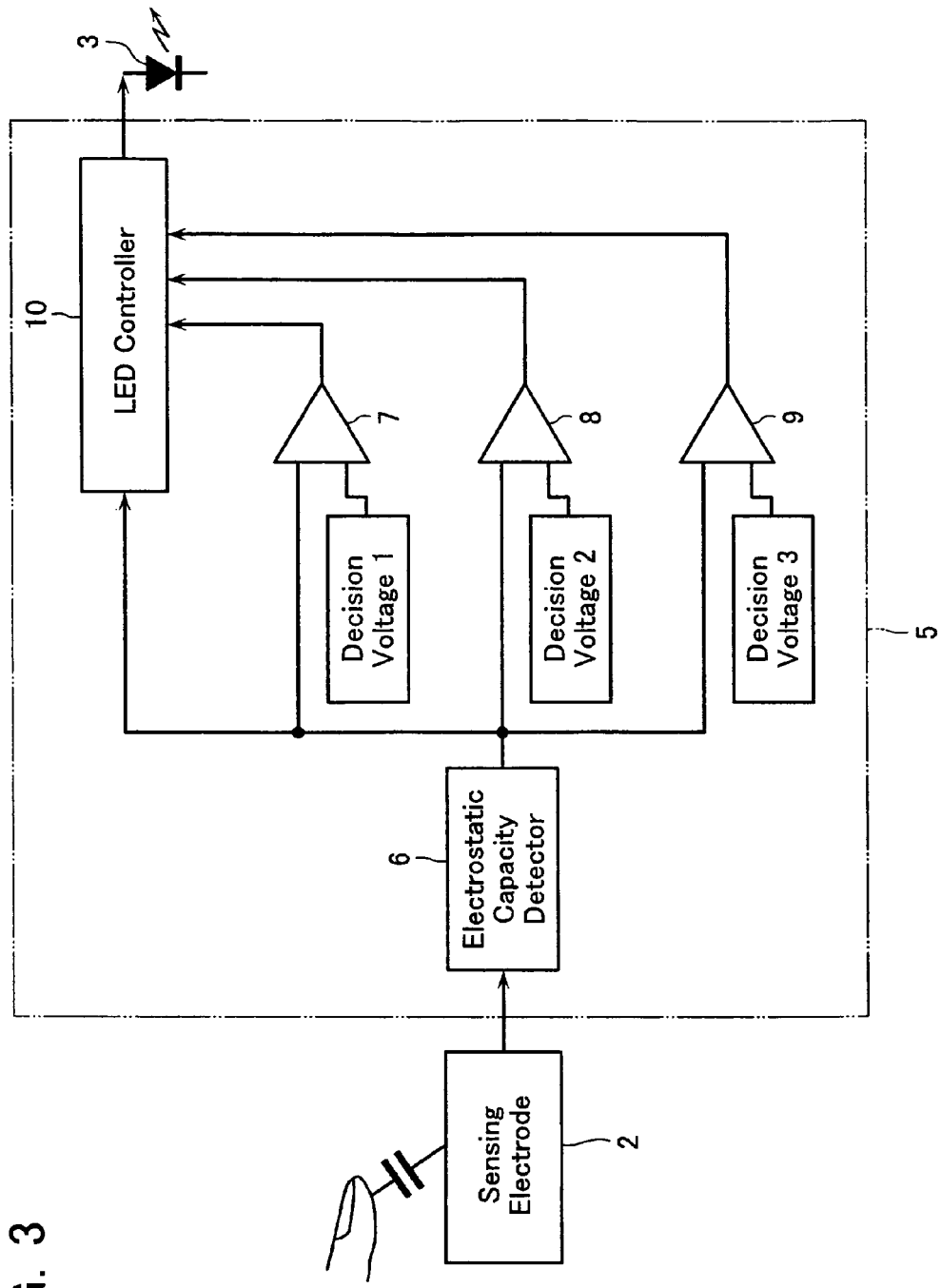
FIG. 3 is a circuit diagram showing an electrical arrangement in the illuminator.

FIG. 3 is a block diagram showing an electrical arrangement in the illuminator.

An electrostatic capacity detector 6 generates a detection value corresponding to an electrostatic capacity between the sensing electrode 2 and the ground and provides the detection value to three comparators 7-9 and an LED controller 10 operative to control the lighting condition of the LED 3. The comparator 7 receives the detection value at one input and a previously determined decision voltage 1 at the other input for comparison to obtain a magnitude relation therebetween and provides a decision value to the LED controller 10. The comparator 8, 9 similarly inputs the detection value into one side and a respective decision voltage 2, 3 into the other side for comparison to obtain a magnitude relations therebetween and provides a respective decision value to the LED controller 10. In this case, the decision voltages 1-3 are designed to have different values, for example, as in (Decision voltage 1<Decision voltage 2<Decision voltage 3). The LED controller 10 inputs the decision values from the comparators 7-9 into one side and the detection value from the electrostatic capacity detector 6 into the other side and generates a control value corresponding to the decision value and the detection value. Based on the control value, the current supplied to the LED 3 is varied to control lighting of the LED 3.

Figure 4:
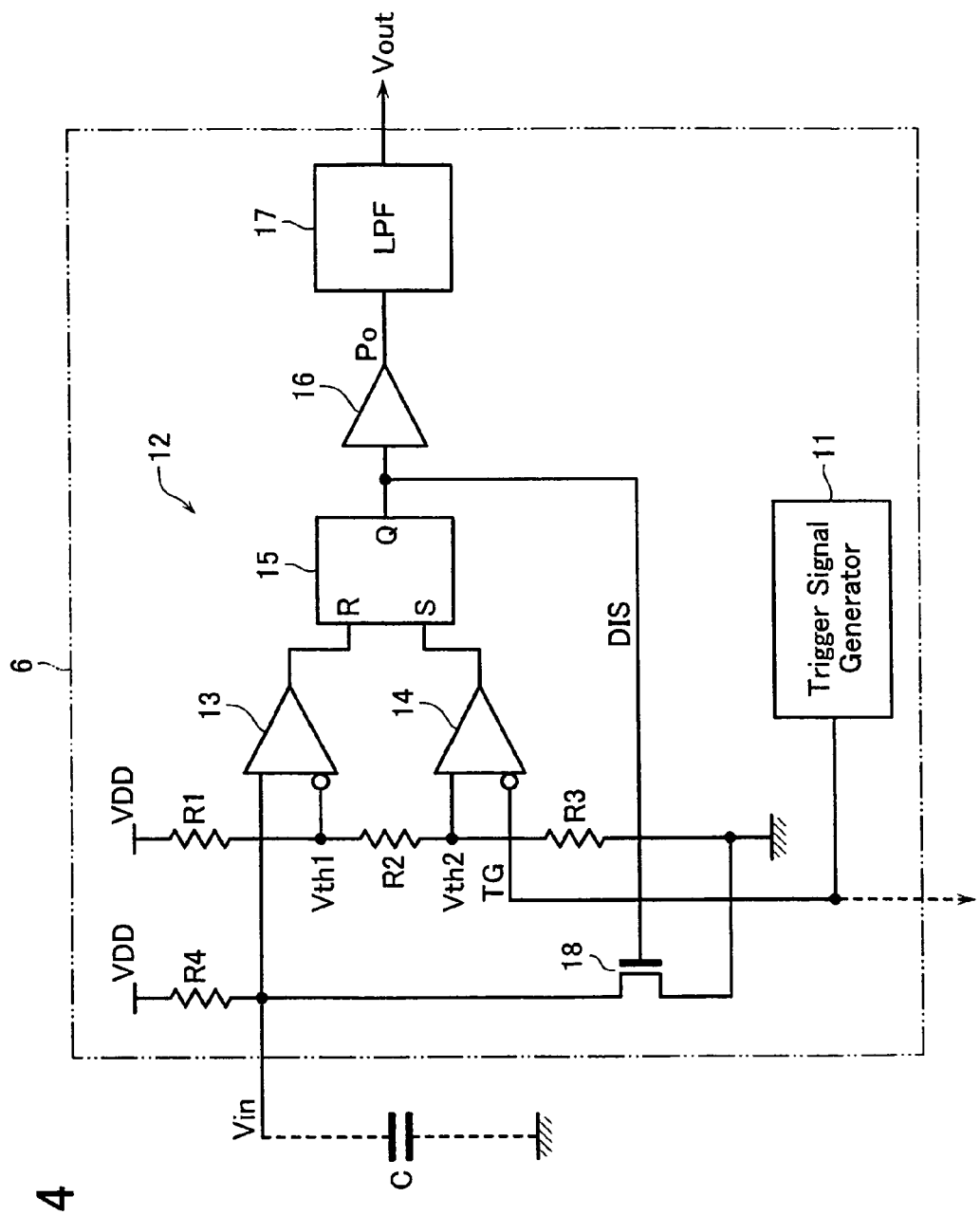
FIG. 4 is a circuit diagram showing a detailed electrical arrangement in the illuminator.

FIG. 4 is a circuit diagram showing an example of the electrostatic capacity detector with a duty factor variable in accordance with an electrostatic capacity Cx between the sensing electrode 2 and the ground.

The electrostatic capacity detector 6 includes a generator 11 for generating a constant-period trigger signal, and a timer 12 operative to provide a pulse signal Po with a duty factor variable in accordance with the electrostatic capacity connected to the input terminal.

The timer 12 includes, for example, two comparators 13, 14. A RS flip-flop (hereinafter referred to as "RS-FF") 15, is provided, having a reset terminal R and a set terminal S to receive the outputs from these comparators 13, 14, respectively. The timer 12 also includes a buffer 16 operative to transfer the output DIS from the RS-FF 15 to an LPF 17, and a transistor 18 to be on/off controlled by the output DIS from the RS-FF 15.

The comparator 14 compares the trigger signal TG output from the trigger signal generator 11 with a predetermined threshold value Vth2 divided by resistors R1, R2, R3 to provide a set pulse in synchronization with the trigger signal TG. The set pulse is applied to set the Q output of the RS-FF 15. The Q output is used as the discharge signal DIS to turn off the transistor 18. In this case, at a rate determined from a time constant of the electrostatic capacity Cx and a resistance R4 connected between the input terminal and the power line, the electrostatic capacity between the sensing electrode 2 and the ground is charged. When the voltage of the input signal Vin exceeds a threshold value Vth1 determined by the resistors R1, R2, R3, the comparator 13 provides an inverted output to invert the output from the RS-FF 16. As a result, the transistor 18 is turned on and the charge accumulated on the sensing electrode 2 is discharged through the transistor 18, thereby providing the pulse signal Po oscillated at the duty factor based on the electrostatic capacity between the sensing electrode 2 and the ground. The LPF 17 smoothes the output to provide a DC detection signal Vout. Such a circuit may be formed on a FPC (Flexible Printed Circuit Board) or RPC (Rigid Printed Circuit Board).

Another available electrostatic capacity detector may be of the oscillator type that includes an oscillator configured with the use of the electrostatic capacity Cx to detect the electrostatic capacity Cx from the frequency of the oscillator. Alternatively, it may be of the charge transfer type that charges the electrostatic capacity Cx through application of a known voltage and transfers the charge to a condenser having a known capacity to detect the electrostatic capacity Cx from the voltage.

The following description is given to a non-limiting method of dimming the vehicular illuminator thus configured.

Figure 5:
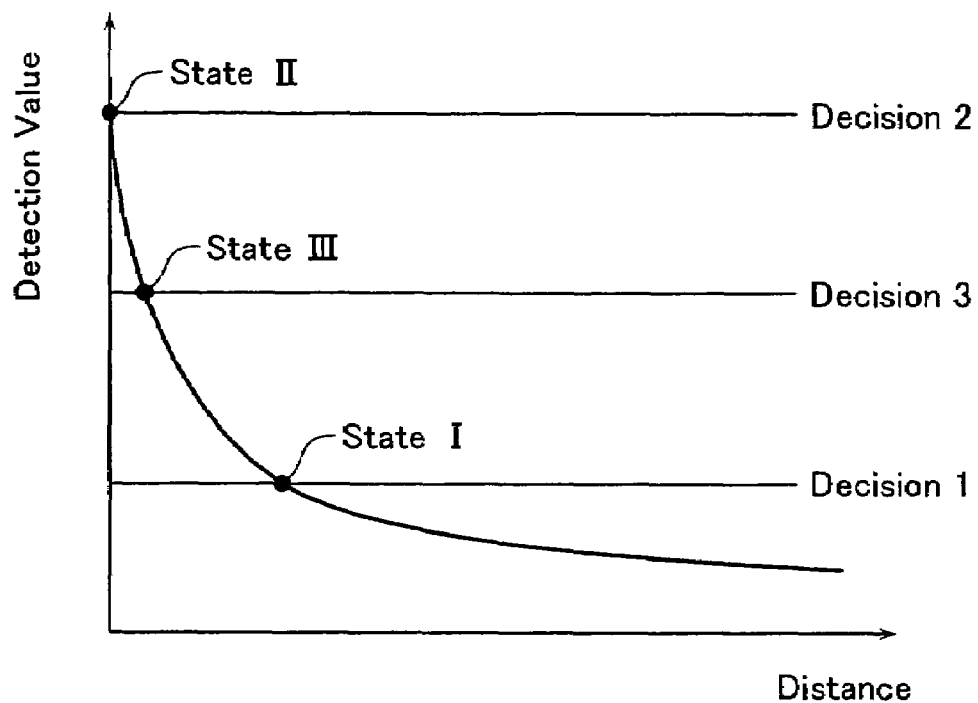
FIG. 5 is a graph showing a relation between a distance and a detection value.
Figure 6A:
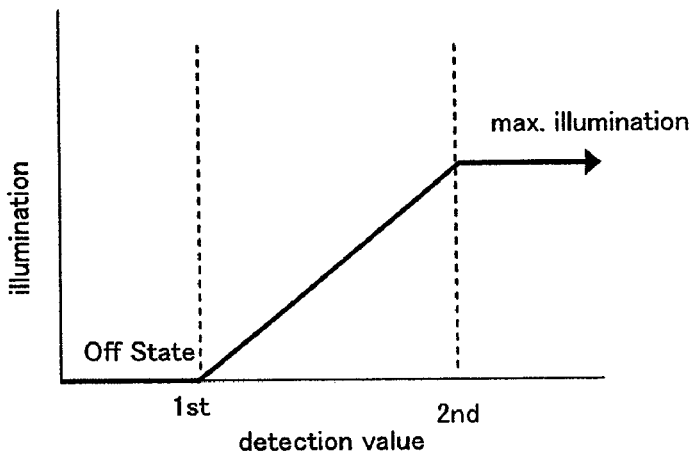
FIGS. 6A to 6K show graphs depicting the progression between light states.
Figure 6B:
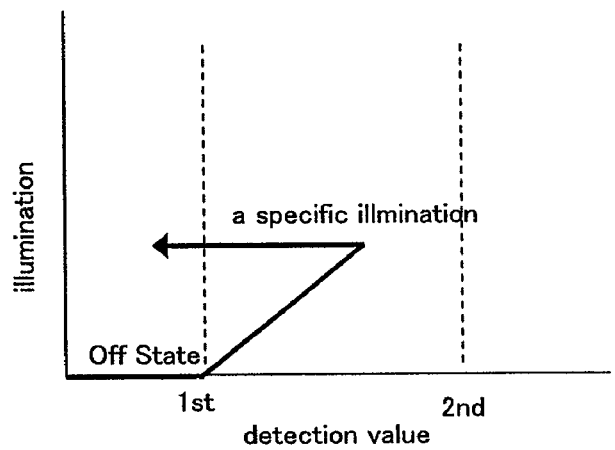
Figure 6C:
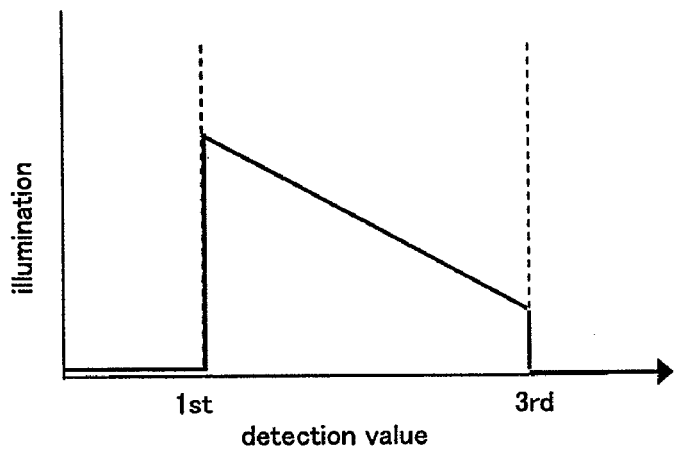
Figure 6D:
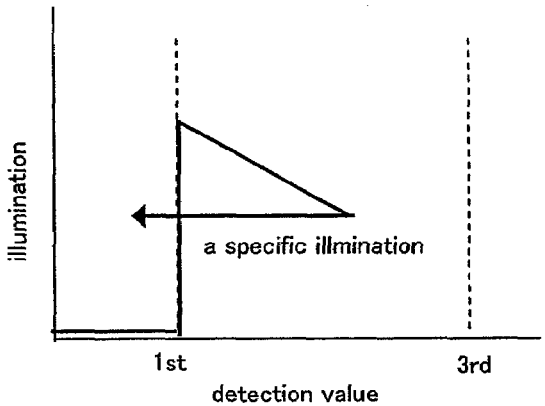
Figure 6E:
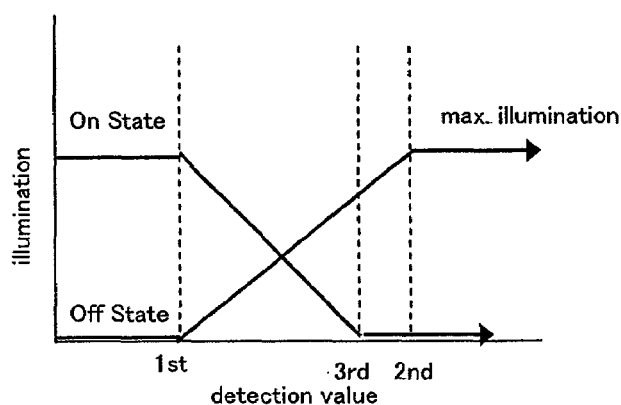
Figure 6F:
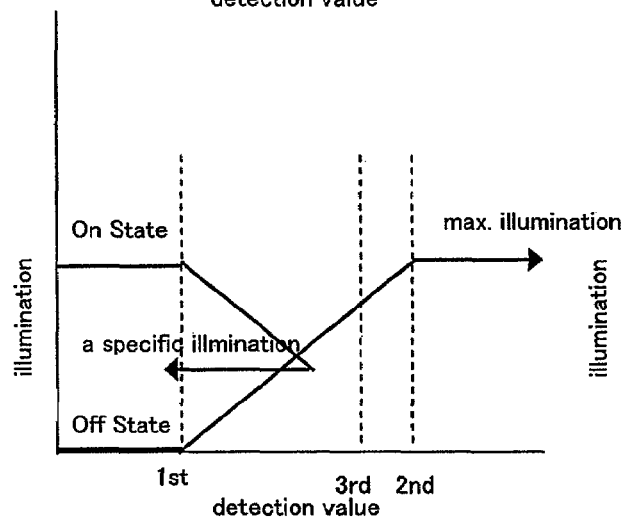
Figure 6G:
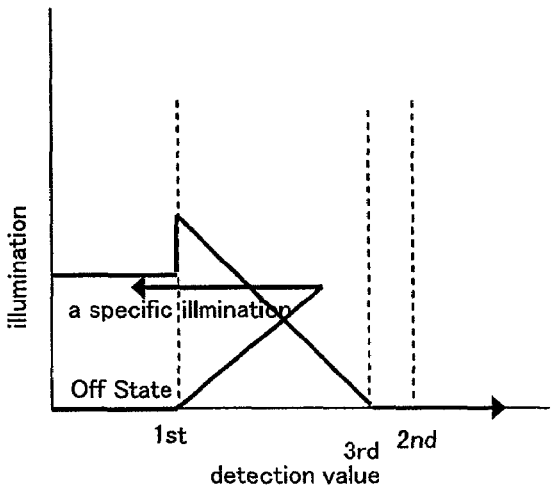
Figure 6H:
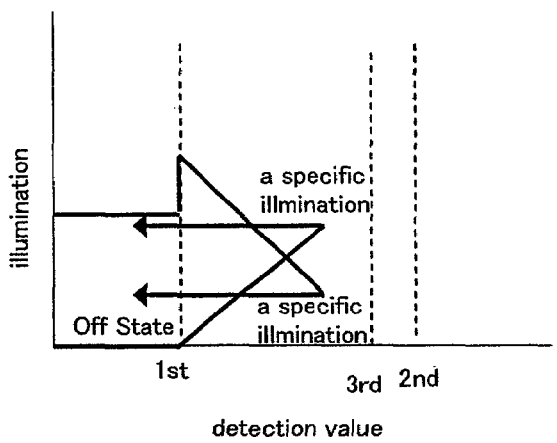
Figure 6I:
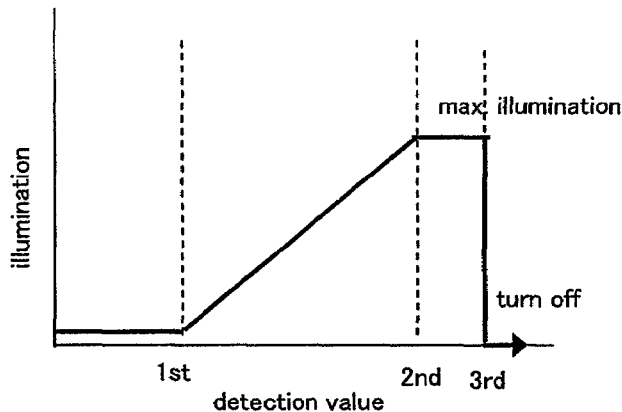
Figure 6J:
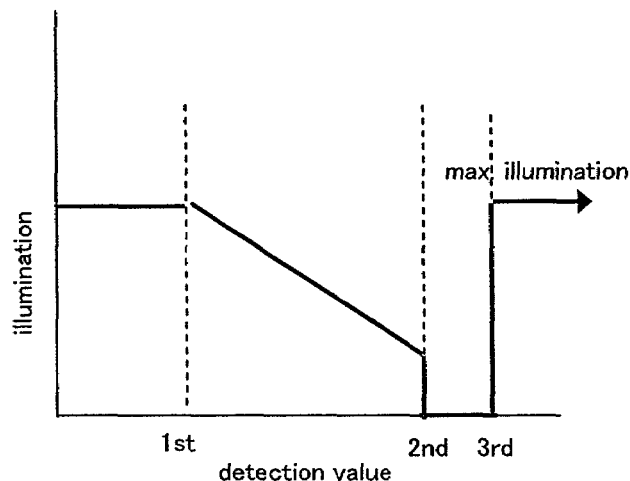
Figure 6K:
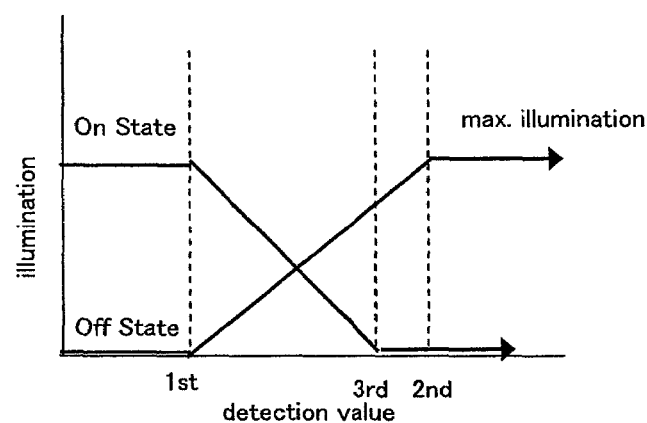

FIG. 5 is a graph showing a relation of a distance between a hand or the like and the sensor (sensing electrode 2) to a detection value detected at the electrostatic capacity detector 6. As a hand or the like approaches the sensor, the detection value increases. The state when the detection value reaches the decision voltage 1 (of FIG. 3) is defined as a state I. The state when the detection value reaches the decision voltage 3 is defined as a state III. The state when the detection value reaches the decision voltage 2 is defined as a state II. The decision voltage 2 is a larger optimal voltage than the decision voltage 1 and the decision voltage 3. For example, the decision voltage 2 may correspond to the state when a hand or the like of the operator touches the sensor or more closely approaches the sensor. One of the decision voltage 1 and the decision voltage 3 may be larger than or have the same value as the other. Namely, a magnitude relation among these decision voltages is determined as (Decision voltage 2>Decision voltage 1≧Decision voltage 3) or (Decision voltage 2>Decision voltage 3≧Decision voltage 1). The LED controller 10 decides this state in accordance with the decision value input from the one side and controls the lighting condition of the LED 3 as follows.

(1) The state when the LED 3 is turned off:

When the operator approaches the sensor with a hand or the like, from state I when the LED 3 is turned off, the LED controller 10 increases the amount of current supplied to the LED 3 in accordance with an increase in the detection value input from the other side. When the hand or the like separates from the sensor, the LED controller maintains the illumination at the time when the hand or the like makes the closest approach to the sensor to turn on the LED 3. In this case, the LED 3 is assumed to have the highest illumination in the state II.

(2) The state when the LED 3 is turned on:

When the operator approaches the sensor with a hand or the like, from state III when the LED 3 is already turned on, the LED controller 10 decreases the amount of current supplied to the LED 3 in accordance with an increase in the detection value input from the other side. When the hand or the like separates from the sensor, the LED controller 10 maintains the illumimation at the time when the hand or the like makes the closest approach to the sensor. In this case, the LED 3 is turned off in the state II.

The vehicular illuminator thus configured does not require the operator to visually confirm the switch. Rather, the operator can perform ON/OFF operation of the illumination and adjustment of the illumination only by bringing the hand close over the sensor where an approximate position of the sensor can be identified, and accordingly can concentrate on driving operation. In addition, the switch comprises an electrostatic capacity sensor and prevents the switch mechanism from protruding into the compartment. This is excellent in design with reduced space. Further, there is less erroneous operation due to ambient environments and less power consumption on standby.

Another non-limiting dimming method is described next. In this dimming method, the magnitude relation among the decision voltages in FIG. 5 is determined as (Decision voltage 2>Decision voltage 3>Decision voltage 1) and the state II can be achieved where the hand nears the sensor without a touch. When the hand or the like nears the sensor from the state I, the LED controller 10 starts to increase the amount of current supplied to the LED 3. In this case, the LED 3 is turned on with the illumination at the state when the hand or the like makes the closest approach during the period. At the state III, the maximum illumination is achieved and the increase of the illumination is stopped. Further, when the hand or the like makes an approach to the state II, the supply of current to the LED 3 is terminated to turn it off. The zone of transition from the state III to the state II is defined as a blind sector.

Yet another non-limiting dimming method is described next. In this dimming method, the magnitude relation among the decision voltages in FIG. 5 is determined as (Decision voltage 2>Decision voltage 3>Decision voltage 1) and the state II can be achieved where the hand nears the sensor without a touch. When the hand or the like nears the sensor from the state I, the LED controller 10 turns on the LED 3 with the maximum illumination and starts to decrease the amount of current supplied to the LED 3 as the hand or the like approaches. In this case, the LED 3 is turned on with the illumination at the state when the hand or the like makes the closest approach during the period. At the state III, the minimum illumination is achieved, that is, the LED 3 is turned off. Further, when the hand or the like makes an approach to the state II, current is supplied to turn on the LED 3 with the maximum intensity. The zone of transition from the state III to the state II is defined as a blind sector.

The various relations between the decision voltages of the detection value and illumination, as discussed above, are depicted in FIGS. 6A-6K.

What is claimed is:

1. A vehicular illuminator provided in an interior of a vehicle, comprising:
    a sensing electrode operative to detect approach of a human body;
    an electrostatic capacity detector operative to detect an electrostatic capacity between the sensing electrode and ground and provide a detection value corresponding to the electrostatic capacity;
    a controller operative to input the detection value for comparison with previously determined n threshold values (n is a natural number), where n is greater than 1, and provide a control value corresponding to a magnitude relation therebetween; and
    a light source operative to illuminate the interior of the vehicle and being controllably dimmed to different illumination levels based on the control value,
    wherein the controller is operative to:
    increase an amount of current supplied to the light source to increase illumination of the light source in accordance with an increase in the detection value, where the detection value reaches a first threshold value starting from an off state of the light source; and
    maintain the amount of current at a maximum level when the detection value reaches a second threshold value,
    wherein, when the detection value decreases before reaching the second threshold value, the controller is operative to maintain illumination of the light source at a specific illumination level attained before the detection value decrease occurred.

2. The vehicular illuminator according to claim 1, wherein the light source comprises an LED.

3. The vehicular illuminator according to claim 1, wherein the sensing electrode comprises a transparent sensing electrode.

4. The vehicular illuminator according to claim 1, wherein the controller is operative to:
    when the light source is already turned on, decrease an amount of current supplied to the light source to decrease illumination of the light source in accordance with an increase in the detection value where the detection value reaches a first threshold value; and
    turn off the light source when the detection value reaches a third threshold value, where at least the first threshold value, a second threshold value and the third threshold value are provided.

5. The vehicular illuminator according to claim 1, wherein the controller is operative to:
    decrease the amount of current supplied to the light source to decrease the illumination of the light source in accordance with an increase in the detection value, where the detection value reaches the first threshold value in an on state of the light source; and
    turn off the light source when the detection value reaches a third threshold value.

6. The vehicular illuminator according to claim 5, wherein the second threshold level is larger than the first and third threshold levels.

7. The vehicular illuminator according to claim 1, wherein the controller is operative to:
    when the light source is already turned on, decrease the amount of current supplied to the light source to decrease the illumination of the light source in accordance with an increase in the detection value, where the detection value reaches the first threshold value; and
    turn off the light source where the detection value reaches a third threshold value.

8. The vehicular illuminator according to claim 7, wherein, when the detection value decreases before reaching the third threshold value, the controller is operative to maintain illumination of the light source at a specific illumination level attained before the detection value decrease occurred.

9. The vehicular illuminator according to claim 1, wherein the controller is operative to:
    increase an amount of current supplied to the light source to increase illumination of the light source in accordance with an increase in the detection value when the detection value reaches a first threshold value;
    maintain the amount of current at a maximum level when the detection value reaches a second threshold value; and
    turn off the light source when the detection value reaches a third threshold value.

10. The vehicular illuminator according to claim 1, wherein the controller is operative to:
    decrease an amount of current supplied to the light source to decrease illumination of the light source in accordance with an increase in the detection value when the detection value reaches a first threshold value;
    turnoff the light source when the detection value reaches a second threshold value; and
    maximize the amount of current when the detection value reaches a third threshold value.

11. A vehicular illuminator provided in an interior of a vehicle, comprising:
    a sensing electrode operative to detect approach of a human body;
    an electrostatic capacity detector operative to detect an electrostatic capacity between the sensing electrode and ground and provide a detection value corresponding to the electrostatic capacity;

a controller operative to input the detection value for comparison with previously determined n threshold values (n is a natural number), where n is greater than 1, and provide a control value corresponding to a magnitude relation therebetween; and a light source operative to illuminate the interior of the vehicle and being controllably dimmed to different illumination levels based on the control value, wherein the controller is operative to:

when the light source is already turned on, decrease an amount of current supplied to the light source to decrease illumination of the light source in accordance with an increase in the detection value where the detection value reaches a first threshold value; and turn off the light source when the detection value reaches a third threshold value, where at least the first threshold value, a second threshold value and the third threshold value are provided, wherein, when the detection value decreases before reaching the third threshold value, the controller is operative to maintain illumination of the light source at a specific illumination level attained before the detection value decrease occurred.

12. A vehicular illuminator provided in an interior of a vehicle, comprising:

a sensing electrode operative to detect approach of a human body;

an electrostatic capacity detector operative to detect an electrostatic capacity between the sensing electrode and ground and provide a detection value corresponding to the electrostatic capacity;

a controller operative to input the detection value for comparison with previously determined n threshold values (n is a natural number), where n is greater than 1, and provide a control value corresponding to a magnitude relation therebetween; and a light source operative to illuminate the interior of the vehicle and being controllably dimmed to different illumination levels based on the control value, wherein the controller is operative to:

increase an amount of current supplied to the light source to increase illumination of the light source in accordance with an increase in the detection value, where the detection value reaches a first threshold value starting from an off state of the light source; and maintain the amount of current at a maximum level when the detection value reaches a second threshold value, wherein the controller is also operative to:

decrease the amount of current supplied to the light source to decrease the illumination of the light source in accordance with an increase in the detection value, where the detection value reaches the first threshold value in an on state of the light source; and turn off the light source when the detection value reaches a third threshold value, wherein, when the detection value decreases before reaching the third threshold value, the controller is operative to maintain illumination of the light source at a specific illumination level attained before the detection value decrease occurred.

13. A vehicular illuminator provided in an interior of a vehicle, comprising:

a sensing electrode operative to detect approach of a human body;

an electrostatic capacity detector operative to obtain a detection value, where the detection value is an electrostatic capacity between the sensing electrode and ground;

means for:

comparing the detection value with previously determined n threshold values (n is a natural number), where n is greater than 1, and for controllably dimming a light source based on the comparison, the light source operative to illuminate the interior of the vehicle, increasing an amount of current supplied to the light source to increase illumination of the light source in accordance with an increase in the detection value, where the detection value reaches a first threshold value starting from an off state of the light source; and maintaining the amount of current at a maximum level when the detection value reaches a second threshold value, wherein, when the detection value decreases before reaching the second threshold value, illumination of the light source is maintained at a specific illumination level attained before the detection value decrease occurred.

* * * * *